US012160986B2

United States Patent
Ayyapureddi

(10) Patent No.: US 12,160,986 B2
(45) Date of Patent: Dec. 3, 2024

(54) DECOUPLING CAPACITORS FOR SEMICONDUCTOR DEVICES

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 178 days.

(21) Appl. No.: 17/144,300

(22) Filed: Jan. 8, 2021

(65) Prior Publication Data
US 2022/0223596 A1    Jul. 14, 2022

(51) Int. Cl.
| | | |
|---|---|---|
| H01L 27/12 | (2006.01) | |
| H01L 29/786 | (2006.01) | |
| H01L 49/02 | (2006.01) | |
| H10B 12/00 | (2023.01) | |

(52) U.S. Cl.
CPC ......... *H10B 12/30* (2023.02); *H01L 27/1222* (2013.01); *H01L 27/124* (2013.01); *H01L 27/1255* (2013.01); *H01L 27/1259* (2013.01); *H01L 28/40* (2013.01); *H01L 29/78675* (2013.01); *H10B 12/03* (2023.02)

(58) Field of Classification Search
CPC ........... H01L 27/10805; H01L 27/1085; H01L 27/1222; H01L 27/124; H01L 27/1255; H01L 27/1259; H01L 28/40; H01L 29/78675

USPC .......................................................... 257/71
See application file for complete search history.

(56) References Cited

U.S. PATENT DOCUMENTS

| | | | |
|---|---|---|---|
| 7,110,316 B2 * | 9/2006 | Choi | G11C 5/147 365/189.11 |
| 7,580,314 B2 * | 8/2009 | Kim | G11C 11/4097 365/185.13 |
| 7,675,768 B1 * | 3/2010 | Kim | G11C 23/00 365/207 |
| 10,607,995 B2 | 3/2020 | Roberts et al. | |
| 10,818,592 B1 * | 10/2020 | Lin | H01L 23/5252 |
| 2002/0191439 A1 * | 12/2002 | Caywood | H01L 27/115 365/185.11 |
| 2004/0041218 A1 * | 3/2004 | Sharma | H01L 27/222 257/E27.005 |
| 2007/0252185 A1 * | 11/2007 | Kang | H01L 27/105 257/295 |
| 2018/0323200 A1 | 11/2018 | Tang et al. | |
| 2019/0103406 A1 | 4/2019 | Tang et al. | |
| 2019/0164985 A1 | 5/2019 | Lee et al. | |

* cited by examiner

*Primary Examiner* — Ori Nadav
(74) *Attorney, Agent, or Firm* — Brooks, Cameron & Huebsch, PLLC

(57) ABSTRACT

Systems, methods and apparatus are provided for decoupling capacitors for an array of vertically stacked memory cells. Embodiments provide that the decoupling capacitors are electrically coupled to a power bus.

10 Claims, 6 Drawing Sheets

DECOUPLING CAPACITORS FOR SEMICONDUCTOR DEVICES

TECHNICAL FIELD

The present disclosure relates generally to memory devices, and more particularly, to decoupling capacitors for semiconductor devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory, e.g., phase-change random access memory, resistive memory, e.g., resistive random-access memory, cross-point memory, ferroelectric random-access memory (FeRAM), or the like.

Memory devices may be used to store information in various electronic devices such as computers, wireless communication devices, cameras, digital displays, and the like. Information can be stored by programming different states of a memory device. For example, binary memory devices can store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

DETAILED DESCRIPTION

Figure 1:
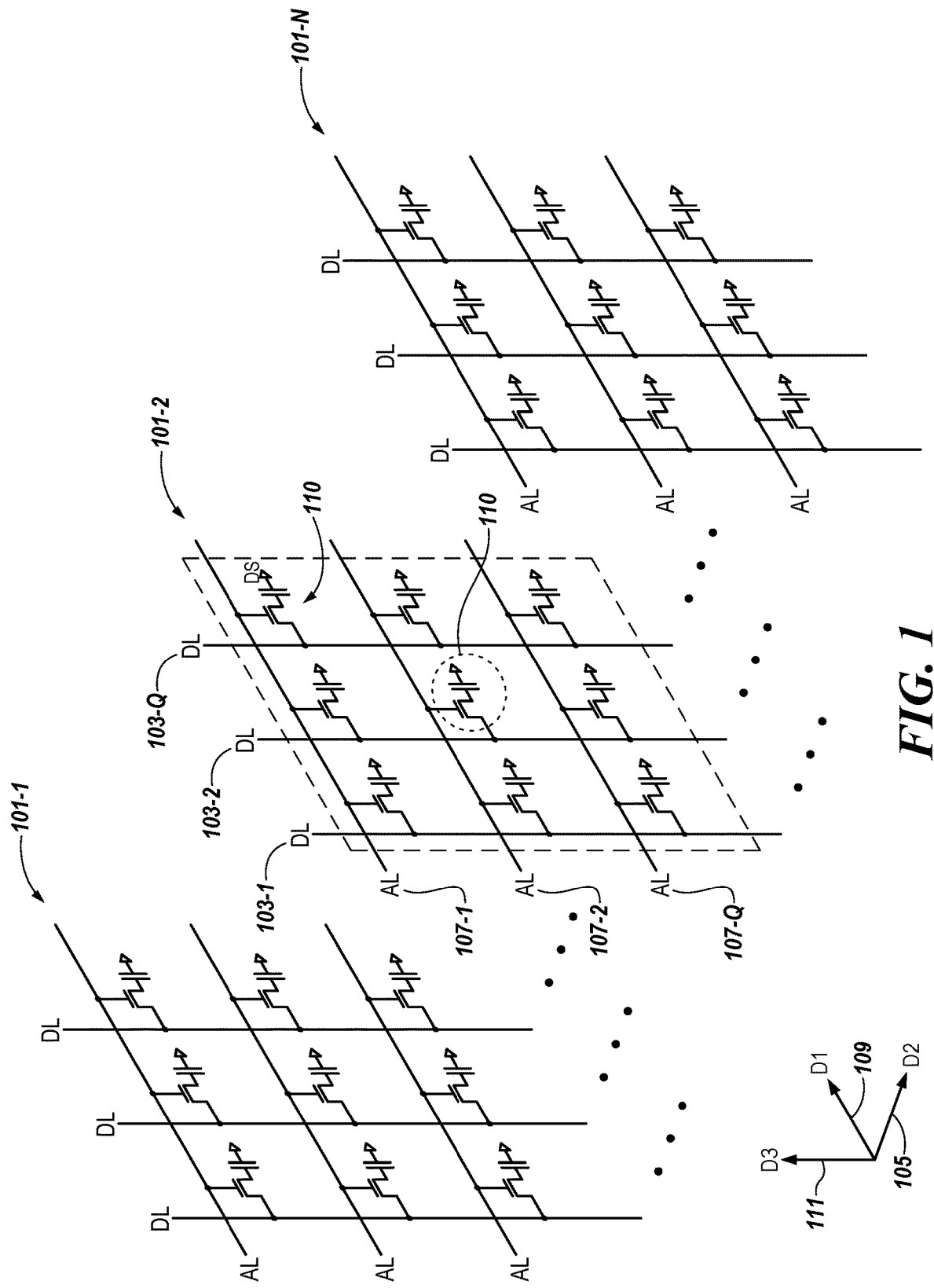
FIG. 1 is a schematic illustration of a portion of a vertical three dimensional (3D) memory in accordance a number of embodiments of the present disclosure.

Embodiments of the present disclosure describe decoupling capacitors for semiconductor devices. Semiconductor devices include a number of conductive paths that may be utilized to distribute power. In some instances, voltage along a conductive path may droop, e.g., drop or decrease, in response to the voltage or current demand of various components of the semiconductor device. If a conductive path experiences a relatively large droop, the conductive path may be unable to provide sufficient voltage or current to components of the semiconductor device to enable proper operation. The decoupling capacitors disclosed herein can be coupled to a power bus to help decrease or eliminate droop and help maintain a voltage over a range of operating conditions. For instance, the decoupling capacitors may advantageously provide additional charge, e.g., voltage, to a power bus over a duration of high demand. This can provide improved operational characteristics for the semiconductor device.

The figures herein follow a numbering convention in which the first digit or digits correspond to the figure number of the drawing and the remaining digits identify an element or component in the drawing. Similar elements or components between different figures may be identified by the use of similar digits. For example, reference numeral 103 may reference element "04" in FIG. 1, and a similar element may be referenced as 203 in FIG. 2. Multiple analogous elements within one figure may be referenced with a reference numeral followed by a hyphen and another numeral or a letter. Such analogous elements may be generally referenced without the hyphen and extra numeral or letter. For example, elements 103-1 and 103-2 or other analogous elements may be generally referenced as 103. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

FIG. 1 is a schematic illustration of a portion of a vertical three dimensional (3D) memory in accordance a number of embodiments of the present disclosure. FIG. 1 illustrates a circuit diagram showing a cell array of a portion of a three dimensional (3D) semiconductor memory device according to embodiments of the present disclosure. FIG. 1 illustrates a cell array may have a plurality of sub cell arrays 101-1, 101-2, . . . , 101-N. The sub cell arrays 101-1, 101-2, . . . , 101-N may have various configurations. For instance, the sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to as wordlines). Also, each of the sub cell arrays, e.g., sub cell array 101-2, may include a plurality of digit lines 103-1, 103-2, . . . , 103-Q (which also may be referred to as bitlines, data lines, or sense lines). In FIG. 1, the access lines 107-1, 107-2, . . . , 107-Q are illustrated extending in a first direction (D1) 109 and the digit lines 103-1, 103-2, . . . , 103-Q are illustrated extending in a third direction (D3) 111; however, embodiments are not so limited. The first direction (D1) 109 and the second direction (D2) 105 may be considered in a horizontal ("X-Y") plane. The third direction (D3) 111 may be considered in a vertical ("Z") plane. Hence, according to a number of embodiments described herein and as illustrated in FIG. 1, the digit lines 103-1, 103-2, . . . , 103-Q are extending in a vertical direction, e.g., third direction (D3) 111; however, embodiments are not so limited. For instance, according to a number of embodiments described herein the digit lines 103-1, 103-2, . . . , 103-Q may extend in a horizontal direction, e.g., direction (D1) 109.

As mentioned, embodiments are not limited to the schematic illustration of FIG. 1. One or more embodiments provide that the digit lines 103-1, 103-2, . . . , 103-Q may extend in the first direction (D1) 109 and the access lines 107-1, 107-2, . . . , 107-Q may extend in the third direction (D3) 111. As such, one or more embodiments provide that the digit lines 103-1, 103-2, . . . , 103-Q may extend in a horizontal direction and that the access lines 107-1, 107-2, . . . , 107-Q extend in a vertical direction.

A memory cell, e.g., 110, may include an access device, e.g., transistor, and a storage node located at an intersection of each access line 107-1, 107-2, . . . , 107-Q and each digit line 103-1, 103-2, . . . , 103-Q. Memory cells may be written to, or read from, using the access lines 107-1, 107-2, . . . , 107-Q and digit lines 103-1, 103-2, . . . , 103-Q. As shown in FIG. 1, the access lines 107-1, 107-2, . . . , 107-Q may conductively interconnect memory cells along horizontal rows of each sub cell array 101-, 101-2, . . . , 101-N, and the digit lines 103-1, 103-2, . . . , 103-Q may conductively interconnect memory cells along vertical columns of each sub cell array 101-, 101-2, . . . , 101-N. One memory cell, e.g. 110, may be located between one access line, e.g., 107-2, and one digit line, e.g., 103-2. Each memory cell may be uniquely addressed through a combination of an access line 107-1, 107-2, . . . , 107-Q and a digit line 103-1, 103-2, . . . , 103-Q.

The access lines 107-1, 107-2, . . . , 107-P may be or include conducting patterns, e.g., metal lines, disposed on and spaced apart from a substrate. As shown in FIG. 1, the access lines 107-1, 107-2, . . . , 107-Q may extend in a first direction (D1) 109. The access lines 107-1, 107-2, . . . , 107-Q in one sub cell array, e.g., 101-2, may be spaced apart from each other in a vertical direction, e.g., in a third direction (D3) 111. However, embodiments are not limited as such.

The digit lines 103-1, 103-2, . . . , 103-Q may be or include conductive patterns, e.g., metal lines, extending in a vertical direction, as shown in FIG. 1, with respect to the substrate, e.g., in a third direction (D3) 111. The digit lines in one sub cell array, e.g., 101-2, may be spaced apart from each other in the first direction (D1) 109. However, embodiments are not limited as such.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 2:
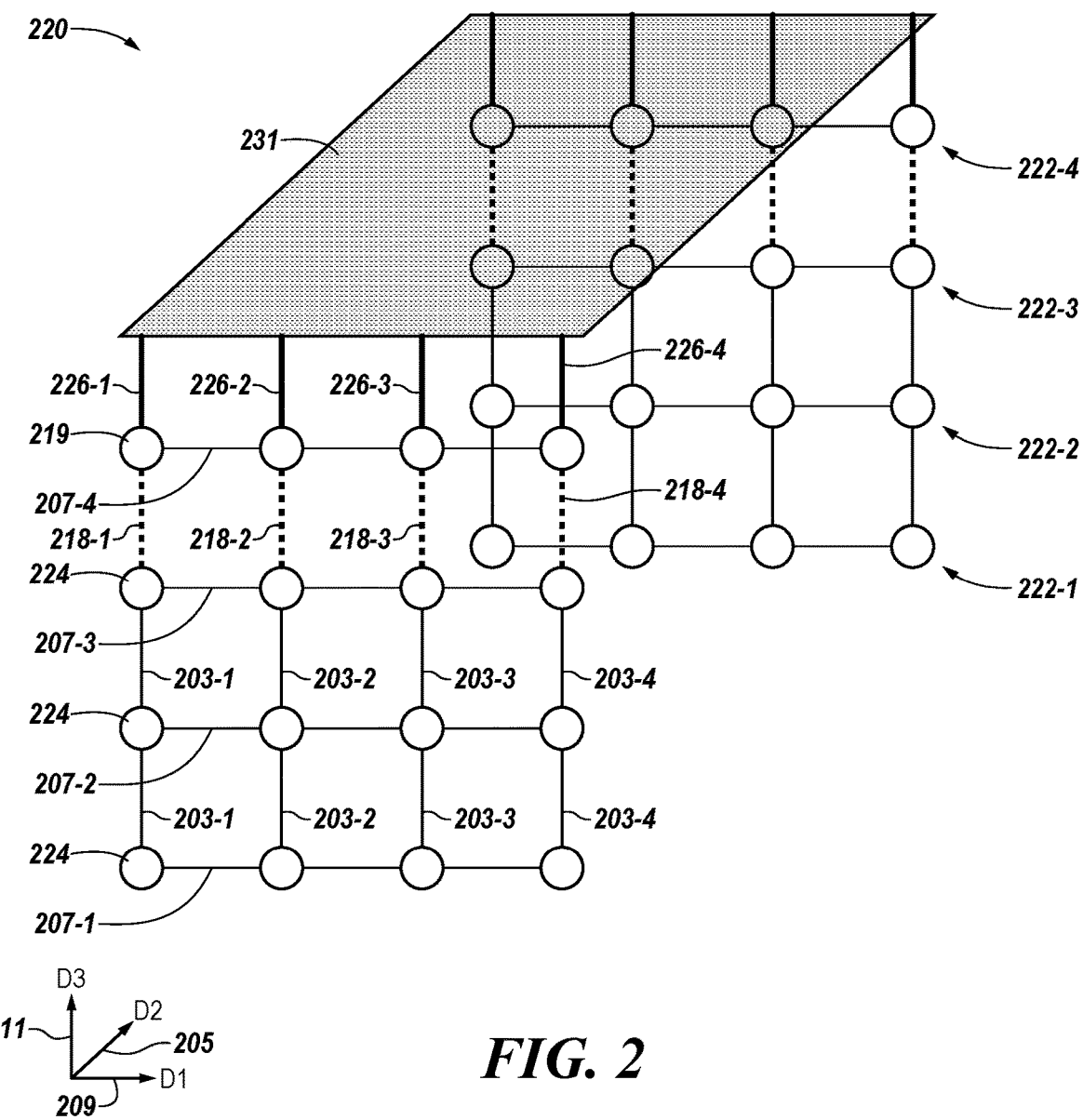
FIG. 2 is a diagram of a portion of a vertical three dimensional (3D) memory in accordance a number of embodiments of the present disclosure.

FIG. 2 is a diagram of a portion of a vertical three dimensional (3D) memory in accordance a number of embodiments of the present disclosure. As shown in FIG. 2, the vertical three dimensional (3D) memory comprises a vertically oriented stack of memory cells in an array 220.

The vertically oriented stack of memory cells may be fabricated such that each cell is formed on one of a plurality of vertical tiers, e.g., levels. As illustrated in FIG. 2, the array 220 includes a first tier 222-1, a second tier 222-2, a third tier 222-3, and a fourth tier 222-4; however, embodiments are not limited to a particular number of tiers. For instance, the array may include fewer or more than four tiers. The vertical tiers are arranged, e.g., stacked, in a vertical direction, e.g., third direction (D3) 211.

As shown in FIG. 2, each of the plurality of vertical tiers respectively includes a number of cells including storage nodes. For instance, tier 222-1 includes cells directly coupled to access line 207-1, among others; tier 222-2 includes cells directly coupled to access line 207-2, among others; tier 222-3 includes cells directly coupled to access line 207-3, among others; and tier 222-4 includes cells directly coupled to access line 207-4, among others. The cells 224 of tiers 222-1, 222-2. 222-3 include capacitors that may be referred to as storage capacitors 224. Cells 219 of tier 222-4, and other cells in tier four, include capacitors that may be referred to as decoupling capacitors. As shown in FIG. 2, the cells 219 including decoupling capacitors are vertically separated from the cells 224 including storage capacitors. In other words, the cells 219 including the decoupling capacitors are extended in the third direction (D3) 211, as compared to the cells 224 including storage capacitors.

As shown in FIG. 2, the vertical digit lines 203-1, 203-2, 203-3, 203-4 conductively interconnect storage capacitors of tier 222-1, tier 222-2, and tier 222-3. As shown in FIG. 2, the access lines 207-1, 207-2, 207-3, 207-4 conductively interconnect cells that are respectively associated with a particular access line.

As shown in FIG. 2, the cells 219 including decoupling capacitors of tier four 222-4 are not conductively interconnected by the vertical digit lines 203-1, 203-2, 203-3, 203-4. Non-conductive vertical lines 218-1, 218-2, 218-3, 218-4 are formed between the cells 219 including decoupling capacitors and respective vertically aligned cells 224 including storage capacitors. The non-conductive vertical lines 218-1, 218-2, 218-3, 218-4 provide that the cells 219 including decoupling capacitors are electrically isolated from the cells 224 including storage capacitors in lower tiers, e.g., tiers 222-1, 221-2, 222-3.

The non-conductive vertical lines 218-1, 218-2, 218-3, 218-4 are formed from a non-conductive material. Examples non-conductive materials dielectric materials, such as oxide materials, e.g., $SiO_2$, and nitride materials, e.g., silicon nitride ($Si_3N_4$), among other non-conductive materials.

As shown in FIG. 2, a power bus 231 can be located above, e.g., formed on, the vertically oriented stack of memory cells. The power bus 231 can be a conductive material, e.g., a metal. As shown in FIG. 2, the power bus 231 is vertically separated, e.g., above, from the cells 219 including the decoupling capacitors, as well as the cells 224 including the storage capacitors. In other words, the power bus 231 is further extended in the third direction (D3) 211, as compared to the cells 219 including decoupling capacitors and the cells 224 including storage capacitors.

The cells 219 including the decoupling capacitors are electrically coupled to the power bus 231 by conductive vertical lines 226-1, 226-2, 226-3, 226-4. Because the cells 219 including the decoupling capacitors are electrically coupled to the power bus 231, the decoupling capacitors can help decrease or eliminate droop and help maintain a voltage over a range of operating conditions. While not illustrated in FIG. 2, the power bus can be electrically coupled to a number of components, such as decoders, sense amplifiers, etc. that can be used to access the memory cells in association with reading and/or writing data, for instance. The decoupling capacitors can be utilized prevent droop of power supply signals such as Vdd and/or Vss signals, for example.

The conductive vertical lines 226-1, 226-2, 226-3, 226-4 may comprise a titanium material. In some embodiments, the conductive vertical lines 226 may comprise a titanium nitride (TiN) material. In some embodiments, the conductive vertical lines 226 may comprise a Ruthenium (Ru) material. In some embodiments, the conductive vertical lines 226 may be tungsten (W). However, embodiments are not so limited.

Figure 3:
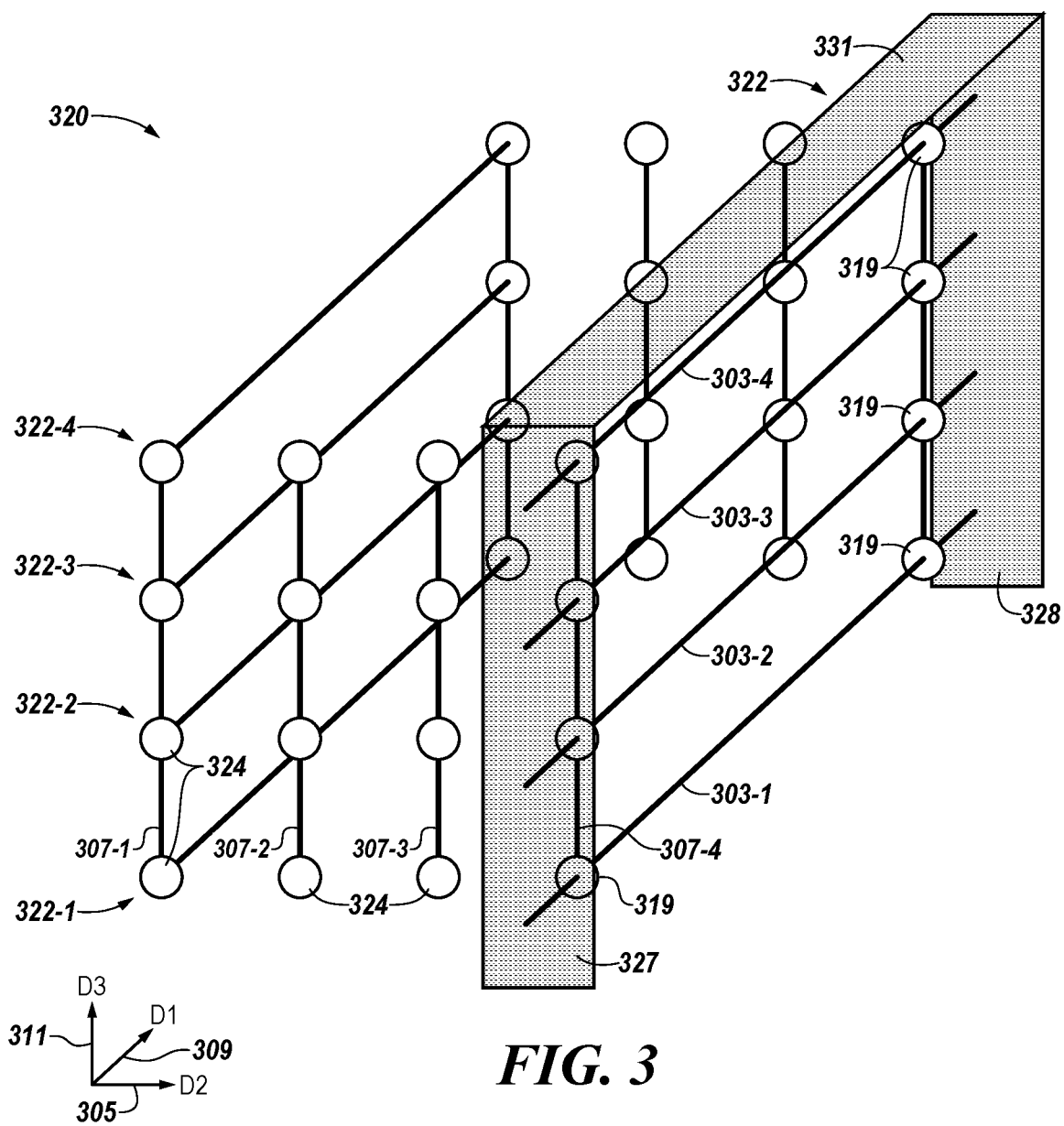
FIG. 3 is a diagram of a portion of a vertical three dimensional (3D) memory in accordance a number of embodiments of the present disclosure.

FIG. 3 is a diagram of a portion of a vertical three dimensional (3D) memory in accordance a number of embodiments of the present disclosure. As shown in FIG. 3, the vertical three dimensional (3D) memory comprises a vertically oriented stack of memory cells in an array 320.

The vertically oriented stack of memory cells may be fabricated such that each cell is formed on one of a plurality of vertical tiers, e.g., levels. As illustrated in FIG. 3, the array 320 may include a tiers 322-1, 322-2, 322-3, 322-4; however, embodiments are not limited to a particular number of tiers. For instance, the array may include fewer or more than four tiers. The vertical tiers are arranged, e.g., stacked, in a vertical direction, e.g., third direction (D3) 311.

As shown in FIG. 3, the array 320 includes horizontal digit lines 303-1, 303-2, 303-3, 303-4 that conductively interconnect cells that are respectively associated with a particular digit line, and vertical access lines that 307-1, 307-2, 307-3, 307-4 conductively interconnect cells that are respectively associated with a particular access line.

As shown in FIG. 3, a power bus 331 can be formed on the vertically oriented stack of memory cells. Cells that are electrically coupled to the power bus, e.g., by a respective horizontal digit line 303-1, 303-2, 303-3, 303-4, are referred to as cells 319 including decoupling capacitors. Cells that are not electrically coupled to the power bus are referred to as cells 324 including storage capacitors.

As shown in FIG. 3, horizontal digit lines 303-1, 303-2, 303-3, 303-4 are electrically coupled to the power bus 331. The horizontal digit lines 303-1, 303-2, 303-3, 303-4 are coplanar and form a planar slice 322 of the array 320 that includes cells 319 including decoupling capacitors from tier 322-1, the tier 322-2, the tier 322-3, and the tier 322-4. Cells 319 including decoupling capacitors in the planar slice 322 are horizontally separated from cells 324 including the storage capacitors, which are not in the planar slice 322 in a same tier. While FIG. 3 illustrates that the planar slice 322 is located at an end portion of the array 320 embodiments are not so limited. For instance, a planar slice 322 may be located at an interior portion of the array 320, e.g., such that a cell including a decoupling capacitor in a particular tier is located between cells including storage capacitors in the same tier.

One or more embodiments provide that each vertical access line in the planar slice 322 is constantly activated, e.g., such that the access devices coupled thereto are "on." Providing that each vertical access line in the planar slice 322 is maintained in an activated state, e.g., constantly on, ensures that each cell 319 including a decoupling capacitor in the planar slice 322 is actively coupled to a respective horizontal digit line 303.

As mentioned, the power bus 331 can be formed on the vertically oriented stack of memory cells. As shown in FIG. 3, the power bus 331 can include a first vertical portion 327, a second vertical portion 328, and a horizontal portion 329, wherein the first vertical portion 327 and the second vertical portion 328 are electrically coupled, e.g., contact, the horizontal portion 329. As shown in FIG. 3, the first vertical portion 327 and second vertical portion 328 each extend the third direction (D3) 311 and the horizontal portion 329 extends in the first direction (D1) 309. As shown in FIG. 3, portions of the power bus 331 are coplanar with the horizontal digit lines 303-1, 303-2, 303-3, 303-4. As shown in FIG. 3, portions of the power bus 331 are horizontally separated from the cells 319 including the decoupling capacitors and horizontally separated from the cells 324 including the storage capacitors in a same tier. As shown in FIG. 3, portions of the power bus 331 are vertically separated from the cells 319 including the decoupling capacitors and vertically separated from the cells 324 including storage capacitors in a same tier.

Figure 4:
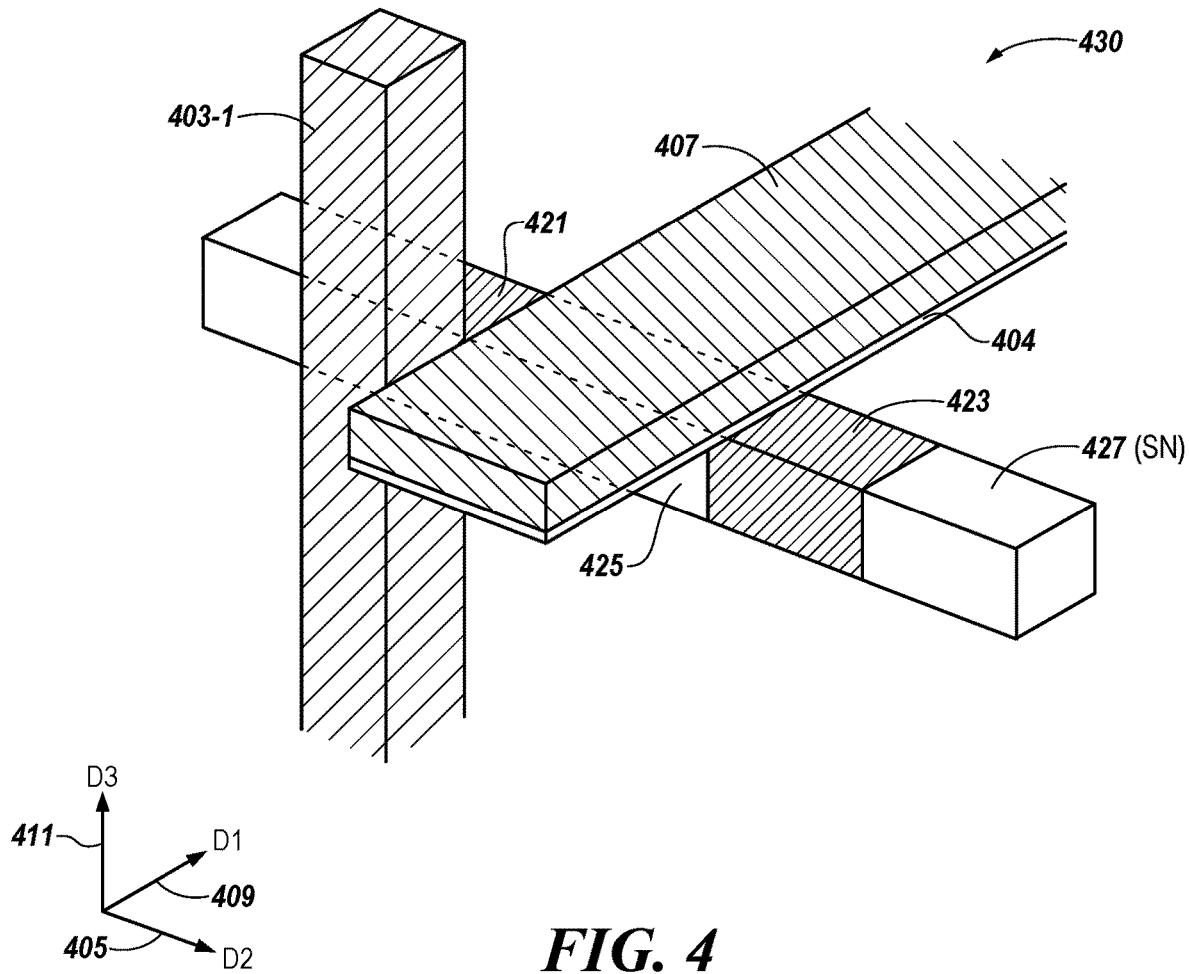
FIG. 4 is a diagram of a portion of a unit cell in accordance with a number of embodiments of the present disclosure.

FIG. 4 is a diagram of a portion of a unit cell in accordance with a number of embodiments of the present disclosure. FIG. 4 illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 4, the first and the second source/drain regions, 421 and 423, may be impurity doped regions to the laterally oriented access devices 430. The first and the second source/drain regions may be separated by a channel 425 formed in a body of semiconductor material, e.g., a body region, of the horizontally oriented access devices 430. The first and the second source/drain regions, 421 and 423, may be formed from an n-type or p-type dopant doped in the body region. Embodiments are not so limited.

For example, for an n-type conductivity transistor construction the body region of the laterally oriented access devices 430 may be formed of a low doped p-type (p−) semiconductor material. In one embodiment, the body region and the channel 425 separating the first and the second source/drain regions, 421 and 423, may include a low doped, p-type, e.g., low dopant concentration (p−) polysilicon material consisting of boron (B) atoms as an impurity dopant to the polycrystalline silicon. The first and the second source/drain regions, 421 and 423, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorus (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 421 and 423, may include a high dopant concentration, n-type conductivity impurity, e.g., high dopant (n+), doped in the first and the second source/drain regions, 421 and 423. In some embodiments, the high dopant, n-type conductivity first and second drain regions 421 and 423 may include a high concentration of phosphorus (P) atoms deposited therein. Embodiments, however, are not limited to this example. In other embodiments, the access devices 430, e.g., transistors, may be of a p-type conductivity construction in which case the impurity, e.g., dopant, conductivity types would be reversed.

As shown in the example embodiment of FIG. 4, the first source/drain region 421 may occupy an upper portion in the body of the laterally oriented access devices 430. For example, the first source/drain region 421 may have a bottom surface within the body of the horizontally oriented access device 430 which is located higher, vertically in the third direction (D3) 411, than a bottom surface of the body of the laterally, horizontally oriented access device 430. As such, the transistor 430 may have a body portion which is below the first source/drain region 421 and is in electrical contact with a body contact, for instance. Further, as shown in the example embodiment of FIG. 4, an access line 407 may disposed on a top surface opposing and coupled to a channel region 425, separated therefrom by a gate dielectric 404. The gate dielectric material 404 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 404 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc. One or more embodiments provide that the gate dielectric 404 comprises a silicon dioxide (SiO2) material, aluminum oxide ($Al_2O_3$) material, a high dielectric constant (k), e.g., high-k, dielectric material, and/or combinations thereof.

As shown in the example embodiment of FIG. 4, a digit line may be vertically extending in the third direction (D3) 411 adjacent a sidewall of the first source/drain region 421 in the body to the horizontally oriented access devices 430, e.g., transistors horizontally conducting between the first and the second source/drain regions 421 and 423 along the second direction (D2) 405. In this embodiment, the vertically oriented digit line 403-1 is formed asymmetrically adjacent in electrical contact with the first source/drain regions 421. The digit line 403-1 may be formed as asymmetrically to reserve room for a body contact in the channel region 425, for instance.

Figure 5:
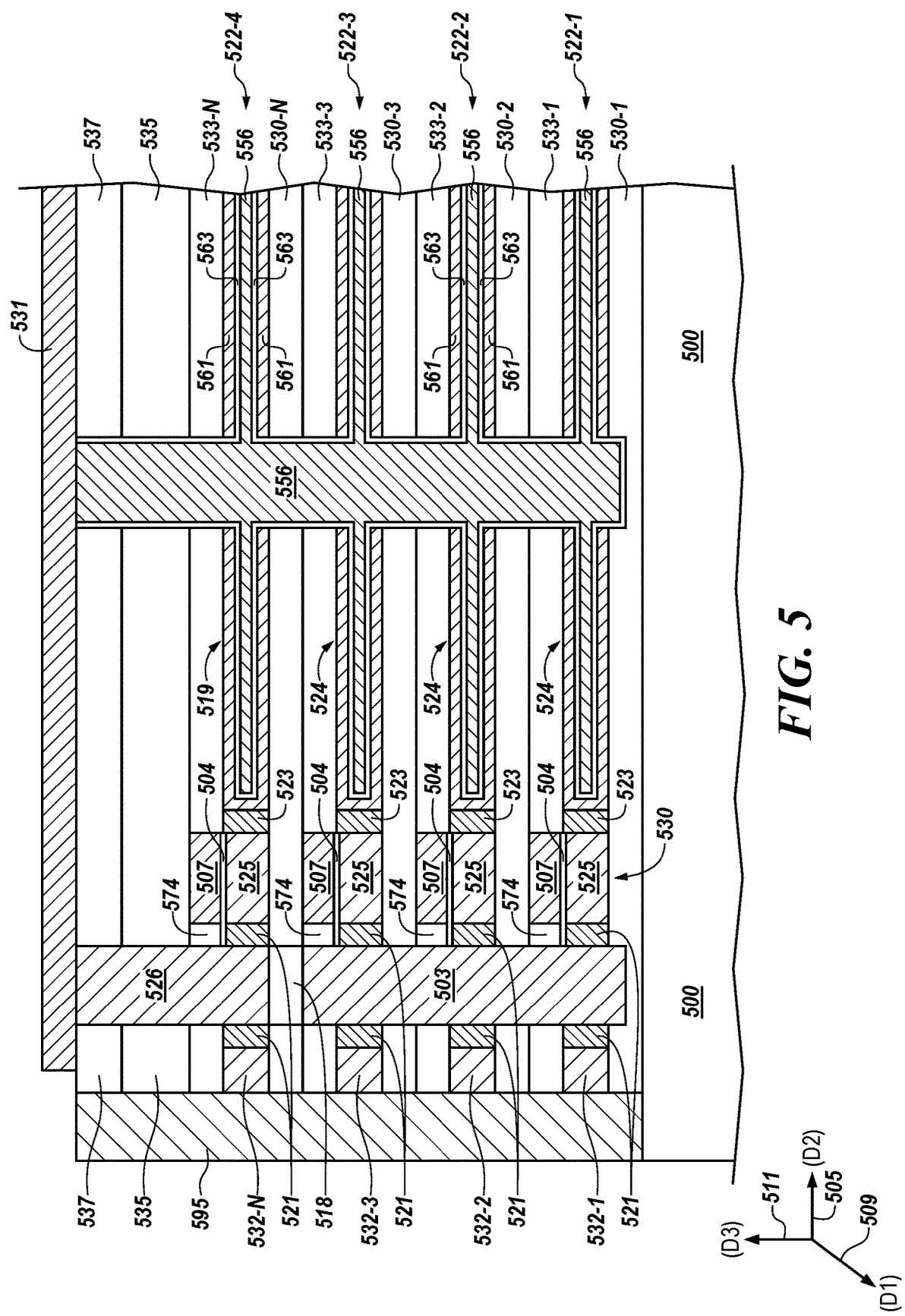
FIG. 5 is a cross-sectional view, of a portion of a semiconductor device, in accordance with a number of embodiments of the present disclosure.

FIG. 5 is a cross-sectional view, of a portion of a semiconductor device, in accordance with a number of embodiments of the present disclosure. In the example embodiment shown in the example of FIG. 5, alternating layers of a first dielectric material, 530-1, 530-2, . . . , 530-N, a semiconductor material, 532-1, 532-2, . . . , 532-N, and a second dielectric material, 533-1, 533-2, . . . , 533-N, form a vertical stack on a working surface of a semiconductor substrate 500. Embodiments, however, are not limited to this example and more or fewer repeating iterations may be included.

As illustrated in FIG. 5, a semiconductor device can include the power bus 531. The power bus 531 can be located above, e.g., formed on, the vertically oriented stack of memory cells. The power bus 531 is vertically separated, e.g., above, from the cells 519 including the decoupling capacitors, as well as the cells 524 including the storage capacitors. While not shown in FIG. 5, the power bus 531 can a number of vertical portions, e.g., as discussed with FIG. 3.

As illustrated in FIG. 5, a conductive vertical line 526 can couple cells 519 including the decoupling capacitors to the power bus 531. Further, the non-conductive vertical line 518 can provide that the cells 219 including decoupling capacitors are electrically isolated from the cells 224 including storage capacitors in lower tiers.

While not shown in FIG. 5, materials may be separated from the substrate 500 by an insulator material. In one embodiment, the first dielectric material 530 can be deposited to have a thickness, e.g., vertical height in the third direction (D3), in a range of twenty nanometers (nm) to sixty nm. In one embodiment, the semiconductor material 532 can be deposited to have a thickness, e.g., vertical height, in a range of twenty nm to one hundred nm. In one embodiment, the second dielectric material 533 can be deposited to have a thickness, e.g., vertical height, in a range of ten nm to thirty nm. Embodiments, however, are not limited to these examples.

In some embodiments, the first dielectric material, 530-1, 530-2, . . . 530-N, may be an interlayer dielectric (ILD). By way of example, and not by way of limitation, the first dielectric material, 530-1, 530-2, . . . , 530-N, may comprise an oxide material, e.g., $SiO_2$. In another example the first dielectric material, 530-1, 530-2, . . . , 530-N, may comprise a silicon nitride ($Si_3N_4$) material (also referred to herein as "SiN"). In another example the first dielectric material, 530-1, 530-2, . . . 530-N, may comprise a silicon oxy-carbide ($SiO_xC_y$) material. In another example the first dielectric material, 530-1, 530-2, . . . , 530-N, may include silicon oxy-nitride ($SiO_xN_y$) material (also referred to herein as "SiON"), and/or combinations thereof. Embodiments are not limited to these examples.

In some embodiments, the semiconductor material, 532-1, 532-2, . . . 532-N, may comprise a silicon (Si) material in a polycrystalline and/or amorphous state. The semiconductor material, 532-1, 532-2, . . . , 532-N, may be a low doped, p-type (p−) silicon material. The semiconductor material, 532-1, 532-2, . . . , 532-N, may be formed by gas phase doping boron atoms (B), as an impurity dopant, at a low concentration to form the low doped, p-type (p−) silicon material. The low doped, p-type (p−) silicon material may be a polysilicon material. Embodiments, however, are not limited to these examples.

In some embodiments, the second dielectric material, 533-1, 533-2, . . . , 533-N, may be an interlayer dielectric (ILD). By way of example, and not by way of limitation, the second dielectric material, 533-1, 533-2, . . . , 533-N, may comprise a nitride material. The nitride material may be a silicon nitride ($Si_3N_4$) material (also referred to herein as "SiN"). In another example the second dielectric material, 533-1, 533-2, . . . , 533-N, may comprise a silicon oxy-carbide (SiOC) material. In another example the second dielectric material, 533-1, 533-2, . . . , 533-N, may include silicon oxy-nitride (SiON), and/or combinations thereof. Embodiments are not limited to these examples. However, according to embodiments, the second dielectric material, 533-1, 533-2, . . . , 533-N, can be chosen to be different in material or composition than the first dielectric material.

As shown in FIG. 5, a semiconductor device may include a gate dielectric material 504. The gate dielectric material 504 may be selected from various dialectic materials. A conductive material 507 may be deposited on the gate dielectric material 504. The conductive material 507 may be so entwined with the gate dielectric material 504 as to be indistinguishable.

In some embodiments, the conductive material 507 may comprise one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc, and/or some other combination thereof. The conductive material 507 entwined with the gate dielectric material 504 may form access lines opposing a channel region (which also may be referred to a wordlines). A number of embodiments provide that the access lines are horizontally oriented access lines extending in the direction (D1) 509, e.g., into/out of the page as illustrated in FIG. 5. However, embodiments are not so limited. A number of embodiments provide that the access lines are vertically oriented access lines.

As shown in FIG. 5, a semiconductor material 595, e.g., a high doped semiconductor material, may be utilized. In some embodiments, the high doped semiconductor material 595 may be a metal such as tungsten (W). Embodiments, however, are not so limited. In some embodiments, the high doped semiconductor material 595 may be a high doped, e.g., p-type, high doped (p+), semiconductor material that may be deposited into the second vertical opening. In this example, the high doped semiconductor material 595 may be a high doped, p-type (p+) silicon material. The high doped, p-type (p+) silicon material 595 may be a polysilicon material. In some examples, the high doped semiconductor material 595 may be a high doped, p-type (p+) silicon-germanium (SiGe) material.

A number of embodiments provide that a dielectric material 574 may be utilized. The dielectric material 574 may be in direct contact with the conductive material 507 and the low doped semiconductor material 532. Embodiments, however, are not limited to this example.

Embodiments provide that a semiconductor device may include a first source/drain region 521. One or more embodiments provide that the first source/drain region 521 may be formed by gas phase doping, e.g., by doping a portion of the semiconductor material 532, for instance. In some embodiments, the first source/drain region may be adjacent a channel region.

Embodiments provide that a semiconductor device may include a second source/drain region 523. Horizontally oriented capacitor cells having a bottom electrode, as discussed further herein may be deposited into the horizontal openings to have electrical contact with the second source/drain regions 523.

Embodiments provide that a semiconductor device may include a first electrode material 561, which may be referred to as a bottom electrode. The first electrode material 561 may be coupled to the second source/drain regions 523 of the horizontal access devices. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line and the other may be connected to a storage node.

One or more embodiments provide that a dielectric material 563 can be deposited on the first electrode material 561. A second electrode material 556, e.g., a top electrode, can be deposited on the dielectric material 563. As shown in FIG. 5, the top electrode 556 may be common to a number of storage nodes, e.g., the cells 519 including the decoupling capacitors of tier 522-4 and the cells 524 including the storage capacitors of tiers 522-1, 522-3, 522-4. Top electrodes 556 may be to be coupled to a common electrode plane, such as a ground plane, for instance. As shown in FIG. 5, the decoupling capacitors of cells 519 and storage capacitors of cells 524 extend in the second direction (D2), left and right in the plane of the drawing sheet, and as such may be referred to as horizontally oriented storage nodes.

As shown in FIG. 5, a dielectric material 574 may be in contact with the body contact 595, e.g., the high doped, p-type (p+) silicon material, of the horizontally oriented access device 530.

As shown in FIG. 5, a conductive material 503 may be formed as a vertical digit line 503. As shown in FIG. 5, the vertical digit lines 503, which extend in the direction (D3) 511, are electrically coupled to the first source/drain regions 521 of the cells including storage capacitors 524. However, embodiments are not so limited. As previously mentioned, one or more embodiments provide that the digit lines 503 are horizontal, while the access lines 507 are vertical; such semiconductor devices can be fabricated utilizing various processing steps. As shown in FIG. 5, the conductive material 503 contacts, e.g., vertically ends at, the non-conductive vertical line 518.

In some embodiments, the conductive material 503 may be formed from a silicide. In some embodiments, the conductive material 503 may comprise a titanium material. In some embodiments, the conductive material 503 may comprise a titanium nitride (TiN) material. In some embodiments, the conductive material 503 may comprise a Ruthenium (Ru) material. In some embodiments, the conductive material may be tungsten (W). However, embodiments are not so limited.

While not illustrated in FIG. 5, one or more embodiments provide the vertical digit lines 503 may pass through the substrate 500 to underlying interconnection metal layers such that the vertical digit lines 503 may be connected to underlying CMOS and interconnection layers beneath the substrate 500. The connection to the underlying metal layers may provide a shorter path for the vertical digit lines 503 to CMOS circuitry beneath the substrate 500, as compared to some other configurations.

Figure 6:
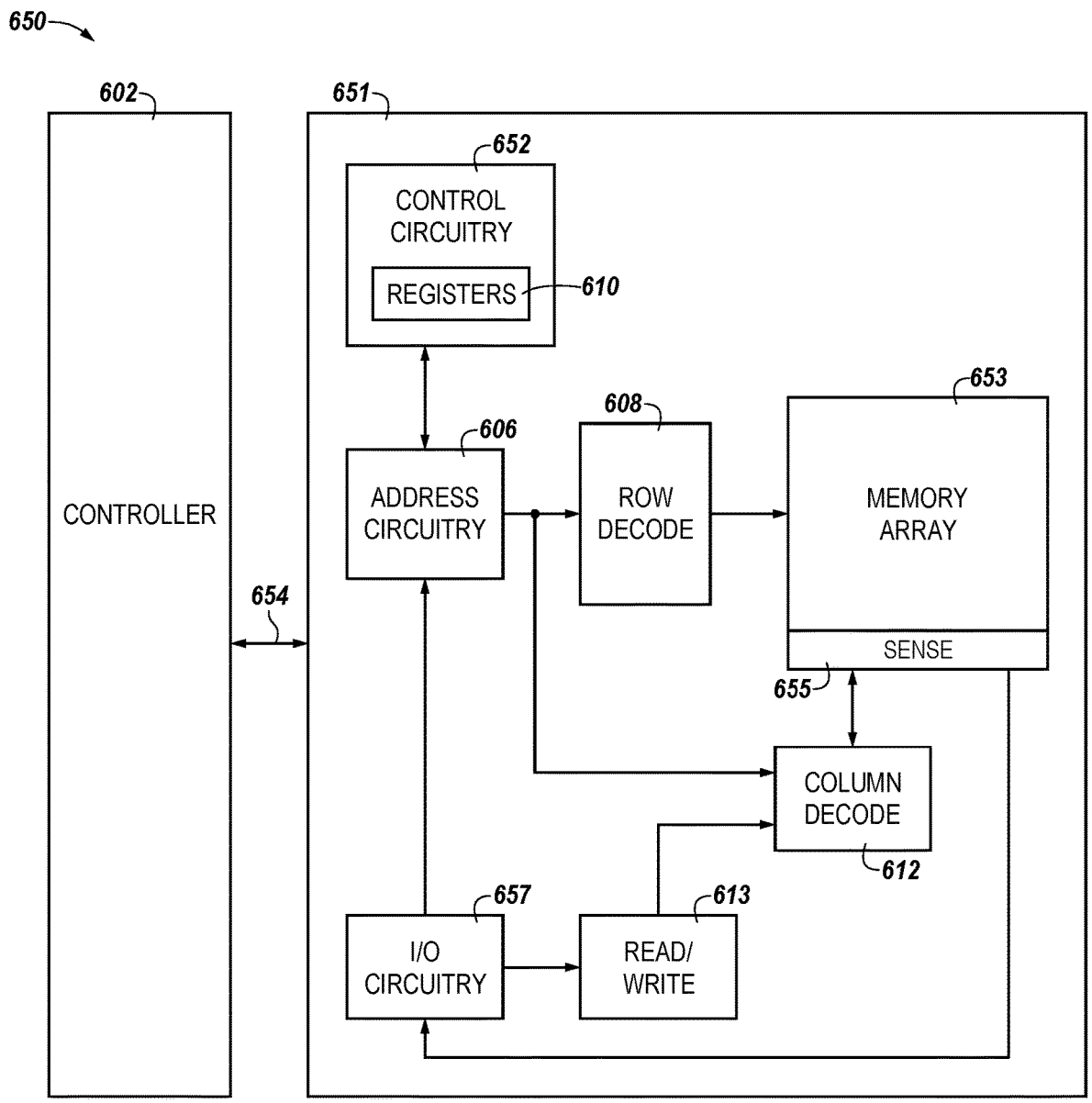
FIG. 6 is a block diagram of an apparatus in accordance with a number of embodiments of the present disclosure.

FIG. 6 is a block diagram of an apparatus in accordance with a number of embodiments of the present disclosure. FIG. 6 is a block diagram of an apparatus in the form of a computing system 650 including a memory device 651 in accordance with a number of embodiments of the present disclosure. As used herein, a memory device 651, a memory array 653, and/or a host 602, for example, might also be separately considered an "apparatus." According to embodiments, the memory device 602 may comprise at least one memory array 653 with a memory cell formed having a digit line and body contact, according to the embodiments described herein.

In this example, system 650 includes a host 602 coupled to memory device 651 via an interface 654. The computing system 650 can be a personal laptop computer, a desktop computer, a digital camera, a mobile telephone, a memory card reader, or an Internet-of-Things (IoT) enabled device, among various other types of systems. Host 602 can include a number of processing resources, e.g., one or more processors, microprocessors, or some other type of controlling circuitry, capable of accessing memory 651. The system 650 can include separate integrated circuits, or both the host 602 and the memory device 651 can be on the same integrated circuit. For example, the host 602 may be a system controller of a memory system comprising multiple memory devices 651, with the system controller 652 providing access to the respective memory devices 651 by another processing resource such as a central processing unit (CPU).

In the example shown in FIG. 18, the host 602 is responsible for executing an operating system (OS) and/or various applications, e.g., processes, that can be loaded thereto, e.g., from memory device 651 via controller 652. The OS and/or various applications can be loaded from the memory device 651 by providing access commands from the host 602 to the memory device 651 to access the data comprising the OS and/or the various applications. The host 602 can also access data utilized by the OS and/or various applications by providing access commands to the memory device 651 to retrieve said data utilized in the execution of the OS and/or the various applications.

For clarity, the system 650 has been simplified to focus on features with particular relevance to the present disclosure. The memory array 653 can be a DRAM array comprising at least one memory cell having a digit line and body contact formed according to the techniques described herein. For example, the memory array 653 can be an unshielded DL 4F2 array such as a 3D-DRAM memory array. The array 653 can comprise memory cells arranged in rows coupled by word lines (which may be referred to herein as access lines or select lines) and columns coupled by digit lines (which may be referred to herein as sense lines or data lines). Although a single array 653 is shown in FIG. 18, embodiments are not so limited. For instance, memory device 651 may include a number of arrays 653, e.g., a number of banks of DRAM cells.

The memory device 651 includes address circuitry 606 to latch address signals provided over an interface 654. The interface can include, for example, a physical interface employing a suitable protocol, e.g., a data bus, an address bus, and a command bus, or a combined data/address/command bus. Such protocol may be custom or proprietary, or the interface 654 may employ a standardized protocol, such as Peripheral Component Interconnect Express (PCIe), Gen-Z, CCIX, or the like. Address signals are received and decoded by a row decoder 608 and a column decoder 612 to access the memory array 653. Data can be read from memory array 653 by sensing voltage and/or current changes on the sense lines using sensing circuitry 655. The sensing circuitry 655 can comprise, for example, sense amplifiers that can read and latch a page, e.g., row, of data from the memory array 653. The I/O circuitry 657 can be used for bi-directional data communication with the host 602 over the interface 654. The read/write circuitry 613 is used to write data to the memory array 653 or read data from the memory array 653. As an example, the circuitry 613 can comprise various drivers, latch circuitry, etc.

Control circuitry 652 decodes signals provided by the host 602. The signals can be commands provided by the host 602. These signals can include chip enable signals, write enable signals, and address latch signals that are used to control operations performed on the memory array 653, including data read operations, data write operations, and data erase operations. In various embodiments, the control circuitry 652 is responsible for executing instructions from the host 602. The control circuitry 652 can comprise a state machine, a sequencer, and/or some other type of control circuitry, which may be implemented in the form of hardware, firmware, or software, or any combination of the three. In some examples, the host 602 can be a controller external to the memory device 651. For example, the host 602 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements, e.g., by direct physical contact, indirectly coupled and/or connected with intervening elements, or wirelessly coupled. The term coupled may further include two or more elements that co-operate or interact with each other, e.g., as in a cause and effect relationship. An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction, e.g., the y-direction or the x-direction, that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device, comprising:
   an array of vertically stacked memory cells, the array comprising:
   respective cells including storage capacitors in the array, wherein:
   each of the respective cells including storage capacitors is formed on a first vertical tier in the array or a second vertical tier in the array; and
   the respective cells including storage capacitors comprise a storage capacitor and a memory cell access transistor coupled to the storage capacitor;
   horizontally oriented access lines coupled to the memory cell access transistors of the respective cells including storage capacitors;
   conductive vertically oriented digit lines coupled to the memory cell access transistors of the respective cells including storage capacitors;

non-conductive vertical lines, wherein a first end of the non-conductive vertical lines is coupled to the conductive vertically oriented digit lines coupled to the respective cells including storage capacitors;
respective cells including decoupling capacitors in the array, wherein:
   each of the respective cells including decoupling capacitors is formed on a third vertical tier in the array and are coupled to a power bus; and
   the respective cells including decoupling capacitors comprise a decoupling capacitor and an access transistor coupled to the decoupling capacitor;
horizontally oriented access lines coupled to the access transistors of the respective cells including decoupling capacitors; and
conductive vertically oriented digit lines coupled to the access transistors of the respective cells including decoupling capacitors;
wherein:
   the respective cells including decoupling capacitors are vertically separated from the respective cells including storage capacitors;
   a second end of the non-conductive vertical lines is coupled to the respective cells including decoupling capacitors;
   the power bus and the conductive vertically oriented digit lines coupled to the respective cells including the decoupling capacitors are electrically isolated from the conductive vertically oriented digit lines coupled to the respective cells including storage capacitors by the non-conductive vertical lines; and
   the respective cells including storage capacitors do not include decoupling capacitors and the respective cells including decoupling capacitors do not include storage capacitors.

2. The memory device of claim 1, further comprising conductive vertical lines between the decoupling capacitors and the power bus, wherein the conductive vertical lines electrically couple the decoupling capacitors to the power bus.

3. The memory device of claim 1, wherein the power bus is vertically separated from the decoupling capacitors.

4. The memory device of claim 1, wherein the power bus is vertically separated from the respective storage capacitors.

5. The memory device of claim 1, wherein the respective storage capacitors are formed on a number of other vertical tiers.

6. The memory device of claim 5, wherein the number of other vertical tiers includes three vertical tiers.

7. The memory device of claim 6, wherein the power bus is a conductive material.

8. The memory device of claim 1, wherein the storage capacitors are structurally the same as the decoupling capacitors.

9. A method for forming decoupling capacitors for an array of vertically stacked memory cells, the method comprising:
   forming respective cells including storage capacitors in the array, wherein each of the respective cells including storage capacitors is formed on a first vertical tier in the array or a second vertical tier in the array and each of the respective cells including storage capacitors comprises a storage capacitor;
   forming memory cell access transistors coupled to respective storage capacitors of each of the respective cells including storage capacitors;
   forming horizontally oriented access lines coupled to the memory cell access transistors of the respective cells including storage capacitors;
   forming conductive vertically oriented digit lines coupled to the memory cell access transistors of the respective cells including storage capacitors;
   forming non-conductive vertical lines, wherein a first end of the non-conductive vertical lines is coupled to the conductive vertically oriented digit lines coupled to the respective cells including storage capacitors;
   forming respective cells including decoupling capacitors in the array, wherein each of the respective cells including decoupling capacitors is formed on a third vertical tier in the array and are coupled to a power bus and each of the respective cells including decoupling capacitors comprises a decoupling capacitor;
   forming access transistors coupled to respective decoupling capacitors of each of the respective cells including decoupling capacitors;
   forming horizontally oriented access lines coupled to the access transistors of the respective cells including decoupling capacitors; and
   forming conductive vertically oriented digit lines coupled to the access transistors of the respective cells including decoupling capacitors;
wherein;
   the respective cells including decoupling capacitors are vertically separated from the respective cells including storage capacitors;
   the power bus and the conductive vertically oriented digit lines coupled to respective cells including the decoupling capacitors are electrically isolated from the conductive vertically oriented digit lines coupled to the respective cells including storage capacitors by the non-conductive vertical lines; and
   the respective cells including storage capacitors do not include decoupling capacitors and the respective cells including decoupling capacitors do not include storage capacitors.

10. The method of claim 9, further comprising forming conductive vertical lines between the decoupling capacitors and the power bus, wherein the conductive vertical lines electrically couple the decoupling capacitors to the power bus.

* * * * *